US011564326B2

(12) United States Patent
Chen et al.

(10) Patent No.: US 11,564,326 B2
(45) Date of Patent: Jan. 24, 2023

(54) AIR MOVER DIRECTION KEYING FOR DUAL AIRFLOW DIRECTION INFORMATION HANDLING SYSTEM

(71) Applicant: Dell Products L.P., Round Rock, TX (US)

(72) Inventors: Julian Yu-Hao Chen, Austin, TX (US); Hung-Pin Chien, New Taipei (TW); Yu-Hung Wang, Tianan (TW)

(73) Assignee: Dell Products L.P., Round Rock, TX (US)

( * ) Notice: Subject to any disclaimer, the term of this patent is extended or adjusted under 35 U.S.C. 154(b) by 175 days.

(21) Appl. No.: 16/984,665

(22) Filed: Aug. 4, 2020

(65) Prior Publication Data

US 2022/0046815 A1 Feb. 10, 2022

(51) Int. Cl.
*H05K 7/14* (2006.01)
*H05K 7/20* (2006.01)

(52) U.S. Cl.
CPC ....... *H05K 7/1491* (2013.01); *H05K 7/20554* (2013.01)

(58) Field of Classification Search
CPC ............. H05K 7/1491; H05K 7/20554; H05K 7/20172
See application file for complete search history.

(56) References Cited

U.S. PATENT DOCUMENTS 6,457,949 B1 * 10/2002 Bendikas .............. F04D 25/166
417/423.5
7,492,591 B1 * 2/2009 Aybay ................ H05K 7/20581
415/206

* cited by examiner

*Primary Examiner* — James Wu
*Assistant Examiner* — Hung Q Dang
(74) *Attorney, Agent, or Firm* — Jackson Walker L.L.P.

(57) ABSTRACT

An air mover assembly may include an air mover comprising a body and a cable extending from the body and one or more air mover holders mechanically coupled to the body. The one or more air mover holders may comprise a plurality of cable maintenance features and a keying feature. The plurality of cable maintenance features may include a first cable maintenance feature configured to maintain the cable in a first configuration of the air mover in a first airflow direction and a second cable maintenance feature configured to maintain the cable in a second configuration of the air mover in a second airflow direction. The keying feature may be configured to mechanically interface with an interfering feature of a chassis when an attempt is made to improperly insert the air mover into the chassis in accordance with a proper airflow direction configuration of the chassis, in order to prevent improper insertion of the air mover into the chassis in accordance with the proper airflow direction configuration of the chassis.

12 Claims, 5 Drawing Sheets

AIR MOVER DIRECTION KEYING FOR DUAL AIRFLOW DIRECTION INFORMATION HANDLING SYSTEM

TECHNICAL FIELD

The present disclosure relates in general to information handling systems, and more particularly to air mover direction keying for a dual airflow direction information handling system.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

As processors, graphics cards, random access memory (RAM) and other components in information handling systems have increased in clock speed and power consumption, the amount of heat produced by such components as a side-effect of normal operation has also increased. Often, the temperatures of these components need to be kept within a reasonable range to prevent overheating, instability, malfunction and damage leading to a shortened component lifespan. Accordingly, cooling fans and blowers, referred to generally herein as "air movers," have often been used in information handling systems to cool information handling systems and their components.

In datacenter environments, it may be desirable to configure the datacenter such that some aisles in the datacenter are "hot aisles" to which air movers exhaust air and some aisles are "cold aisles" from which air movers intake air. Developers of information handling servers are moving towards supporting server chassis in both "standard" orientation with power supplies at the hot aisle of the server chassis and in "reverse" orientation with power supplies at the cold aisle of the server chassis. In both instances, the internal architecture of the server may remain the same in both orientations, meaning that the orientation of air movers must match the airflow direction of the server chassis. In other words, the server chassis must support two orientations of the air movers while also ensuring that orientations are never incorrect and never mixed within the same server chassis.

SUMMARY

In accordance with the teachings of the present disclosure, the disadvantages and problems associated traditional approaches to supporting information handling systems in a datacenter in cold aisle and hot aisle configurations may be substantially reduced or eliminated.

In accordance with embodiments of the present disclosure, an air mover assembly may include an air mover comprising a body and a cable extending from the body and one or more air mover holders mechanically coupled to the body. The one or more air mover holders may comprise a plurality of cable maintenance features and a keying feature. The plurality of cable maintenance features may include a first cable maintenance feature configured to maintain the cable in a first configuration of the air mover in a first airflow direction and a second cable maintenance feature configured to maintain the cable in a second configuration of the air mover in a second airflow direction. The keying feature may be configured to mechanically interface with an interfering feature of a chassis when an attempt is made to improperly insert the air mover into the chassis in accordance with a proper airflow direction configuration of the chassis, in order to prevent improper insertion of the air mover into the chassis in accordance with the proper airflow direction configuration of the chassis.

In accordance with these and other embodiments of the present disclosure, an information handling system may include a chassis and an air mover assembly. The air mover assembly may include an air mover comprising a body and a cable extending from the body and one or more air mover holders mechanically coupled to the body. The one or more air mover holders may comprise a plurality of cable maintenance features and a keying feature. The plurality of cable maintenance features may include a first cable maintenance feature configured to maintain the cable in a first configuration of the air mover in a first airflow direction and a second cable maintenance feature configured to maintain the cable in a second configuration of the air mover in a second airflow direction. The keying feature may be configured to mechanically interface with an interfering feature of a chassis when an attempt is made to improperly insert the air mover into the chassis in accordance with a proper airflow direction configuration of the chassis, in order to prevent improper insertion of the air mover into the chassis in accordance with the proper airflow direction configuration of the chassis.

In accordance with these and other embodiments of the present disclosure, a method may include mechanically coupling an air mover comprising a body and a cable extending from the body to one or more air mover holders, wherein the one or more air mover holders comprise a plurality of cable maintenance features and a keying feature. The plurality of cable maintenance features may include a first cable maintenance feature configured to maintain the cable in a first configuration of the air mover in a first airflow direction and a second cable maintenance feature configured to maintain the cable in a second configuration of the air mover in a second airflow direction. The keying feature may be configured to mechanically interface with an interfering feature of a chassis when an attempt is made to improperly insert the air mover into the chassis in accordance with a proper airflow direction configuration of the chassis, in order to prevent improper insertion of the air mover into the chassis in accordance with the proper airflow direction configuration of the chassis.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Preferred embodiments and their advantages are best understood by reference to FIGS. 1A through 4B, wherein like numbers are used to indicate like and corresponding parts.

For the purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a PDA, a consumer electronic device, a network storage device, or any other suitable device and may vary in size, shape, performance, functionality, and price. The information handling system may include memory, one or more processing resources such as a central processing unit (CPU) or hardware or software control logic. Additional components or the information handling system may include one or more storage devices, one or more communications ports for communicating with external devices as well as various input and output (I/O) devices, such as a keyboard, a mouse, and a video display. The information handling system may also include one or more buses operable to transmit communication between the various hardware components.

For the purposes of this disclosure, information handling resources may broadly refer to any component system, device or apparatus of an information handling system, including without limitation processors, buses, memories, input-output devices and/or interfaces, storage resources, network interfaces, motherboards, integrated circuit packages; electro-mechanical devices (e.g., air movers), displays, and power supplies.

Figure 1A:
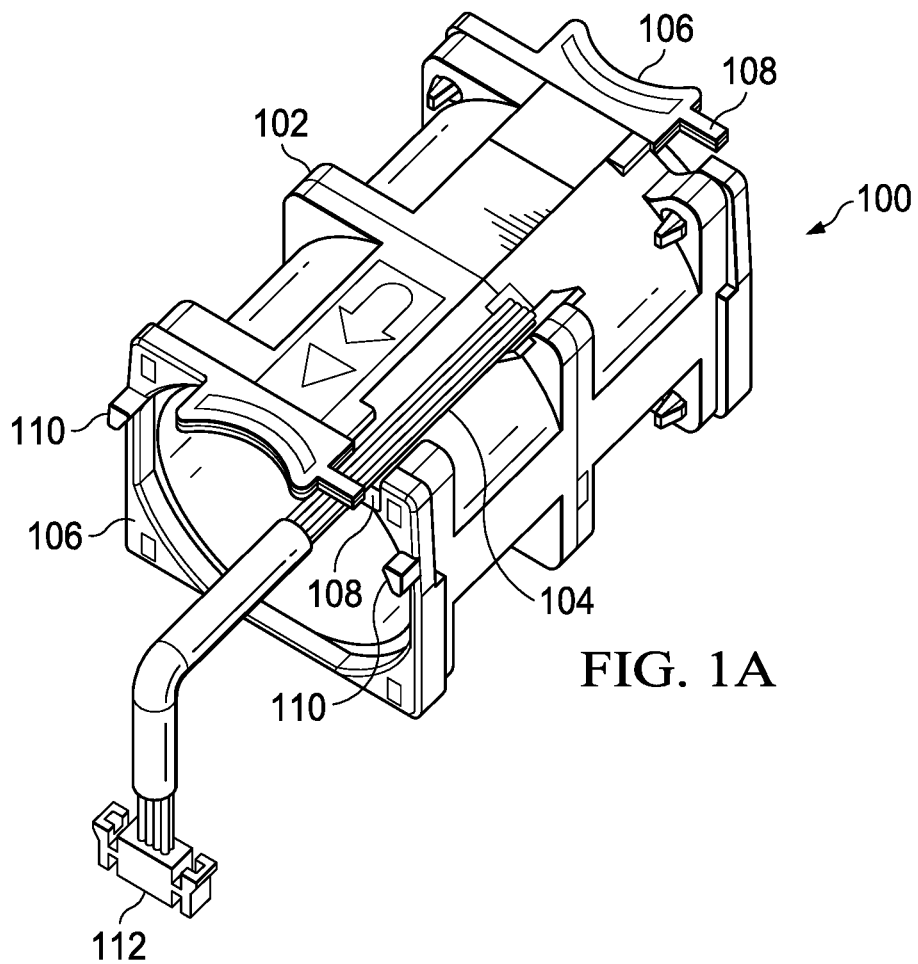
FIGS. 1A and 1B illustrate an example 1U air mover, in accordance with embodiments of the present disclosure.
Figure 1B:
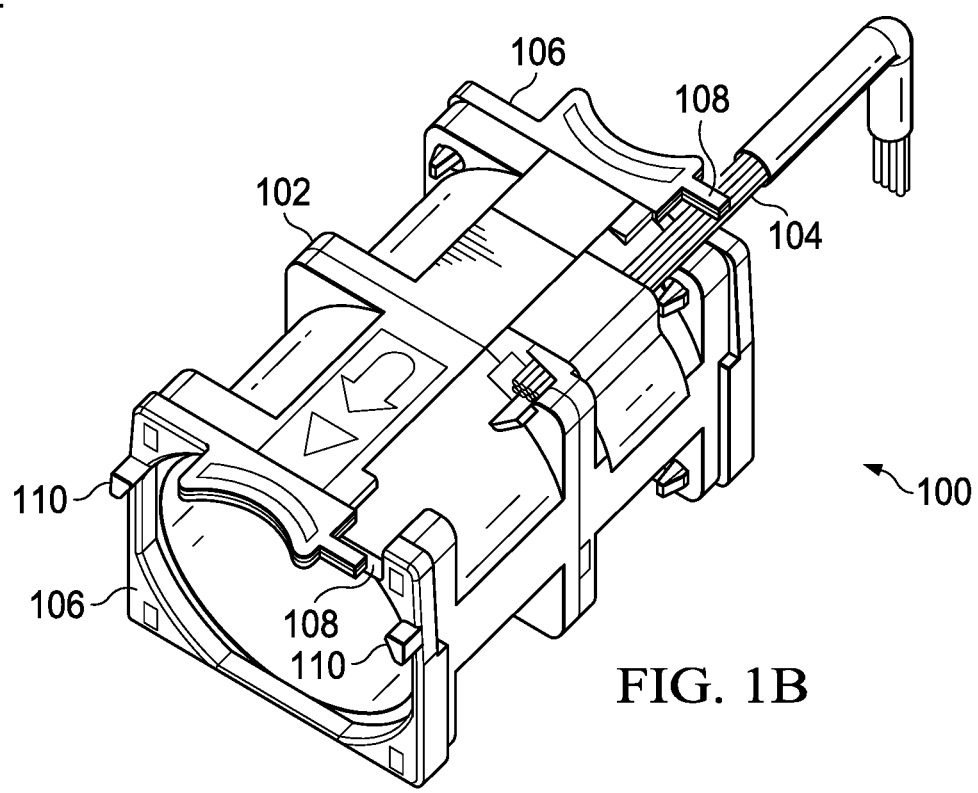

FIGS. 1A and 1B illustrate an example 1U air mover 100, in accordance with embodiments of the present disclosure. FIG. 1A illustrates air mover 100 in a first configuration, while FIG. 1B illustrates air mover 100 in a second configuration.

As shown in FIGS. 1A and 1B, air mover 100 may include a body 102, a cable 104 of wires electrically coupled to and extending from body 102, and air mover holders 106 mechanically coupled to each end of body 102.

Body 102 may include the main components of air mover 100, including an impeller for moving air, a motor for driving the impeller, electric components, electronic components, and other components, and a housing for housing the various components.

Cable 104 may comprise a plurality of electrically-conductive wires for carrying electrical energy for powering air mover 100, for carrying electronic signals for controlling operation of air mover 100, and/or for carrying electronic signals representative of telemetry information of air mover 100. One end of cable 104 may terminate into body 102, while the other end of cable 104 may terminate into a connector 112.

Air mover holders 106 may be sized and shaped to conform to features of air mover 100 and a chassis of an information handling system chassis to guide an air mover 100 into such information handling system chassis. As shown in FIGS. 1A and 1B, each air mover holder 106 may include a cable management feature 108 formed therein that may serve as a guiding and/or retention feature for cable 104. For example, in the first configuration, cable management feature 108 of one air mover holder 106 may be used to guide and retain cable 104 in a particular position, while in the second configuration, cable management feature 108 of the other air mover holder 106 may be used to guide and retain cable 104 in a particular position. Accordingly, a wire exit direction for air mover 100 may be easily configurable based on the orientation of air mover 100 within a chassis and location of a corresponding electrical connector to which connector 112 is to be coupled.

Also as depicted in FIG. 1A, one or both of air mover holders 106 may include keying features 110. Each keying feature 110 may include an interference feature configured to mechanically interact with a corresponding interference feature of an information handling system chassis when an attempt is made to insert air mover 100 in an orientation different than that of the proper airflow direction of such air mover 100.

Figure 2A:
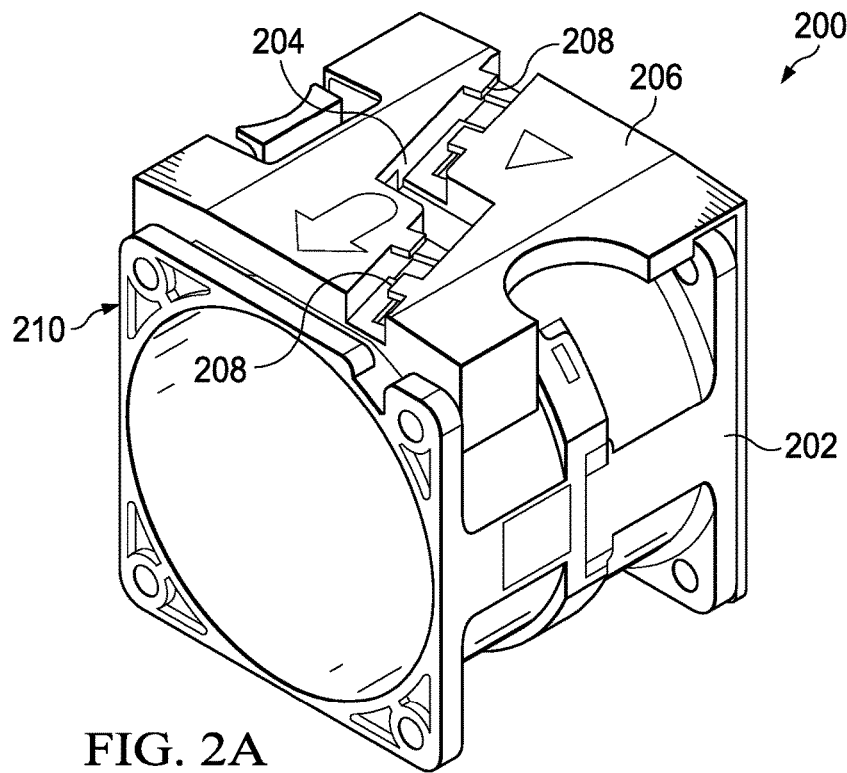
FIGS. 2A and 2B illustrate an example 2U air mover, in accordance with embodiments of the present disclosure.
Figure 2B:
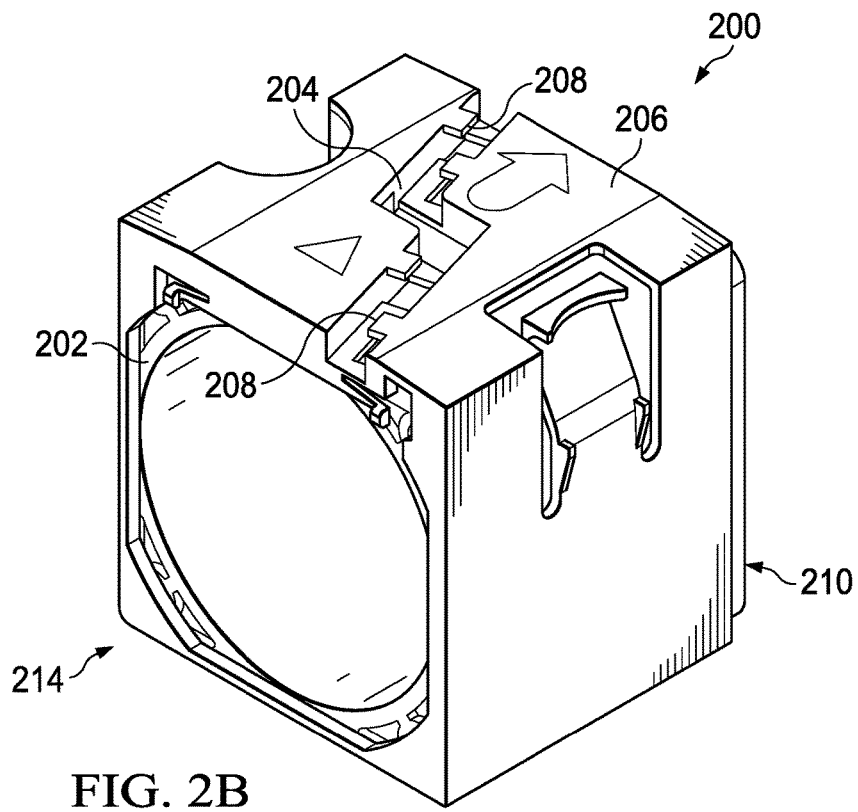

FIGS. 2A and 2B illustrate an example 2U air mover, in accordance with embodiments of the present disclosure. FIG. 2A illustrates a front of air mover 200, while FIG. 2B illustrates a rear of air mover 200.

As shown in FIGS. 2A and 2B, air mover 200 may include a body 202 and an air mover holder 206 mechanically coupled to body 202.

Body 202 may include the main components of air mover 200, including an impeller for moving air, a motor for driving the impeller, electric components, electronic components, and other components, and a housing for housing the various components.

Air mover holder 206 may be sized and shaped to conform to features of air mover 200 and a chassis of an information handling system chassis to guide an air mover 200 into such information handling system chassis. As shown in FIGS. 2A and 2B, air mover holder 206 may include a cable channel 204 and cable management features 208 at each end of cable channel 204. Air mover holder 206 may be mechanically coupled to body 202 such that a cable (which may be identical or similar to cable 104, described above) may extend from body 202 into channel 204. Channel 204 may thus serve as a guiding feature for such cable. Likewise, each cable management feature 208 may serve as a guiding and/or retention feature for a cable of air mover 200. For example, in a first configuration, a first cable management feature 208 may be used to guide and retain a cable in a particular position, while in a second configuration, the other cable management feature 208 may be used to guide and retain the cable in a particular position. Accordingly, a wire exit direction for air mover 200 may be easily configurable based on the orientation of air mover 200 within a chassis and location of a corresponding electrical connector to which a connector of a cable is to be coupled.

Also as demonstrated in FIGS. 2A and 2B, the combination of body 202 and air mover holder 206 may create one or more keying features 210. For example, as shown in FIG. 2A, an offset between an edge of body 202 and air mover holder 206 may create a keying feature 210 such as a void or channel on one the front side of air mover 200 shown in FIG. 2A, while a similar feature is not present on the back side of air mover 200 as shown in FIG. 2B, and instead, an interfering feature 214, such as a corner of air mover holder 206, may be present. Accordingly, when air mover 200 is placed in a proper airflow orientation in a chassis, keying feature 210 may allow passage of air mover 200 by an interfering feature of a chassis, while when air mover 200 is placed in an improper airflow orientation in the chassis, keying feature 214 may interact with a corresponding interfering feature of the chassis to prevent full insertion of air mover 200 into such chassis.

Figure 3A:
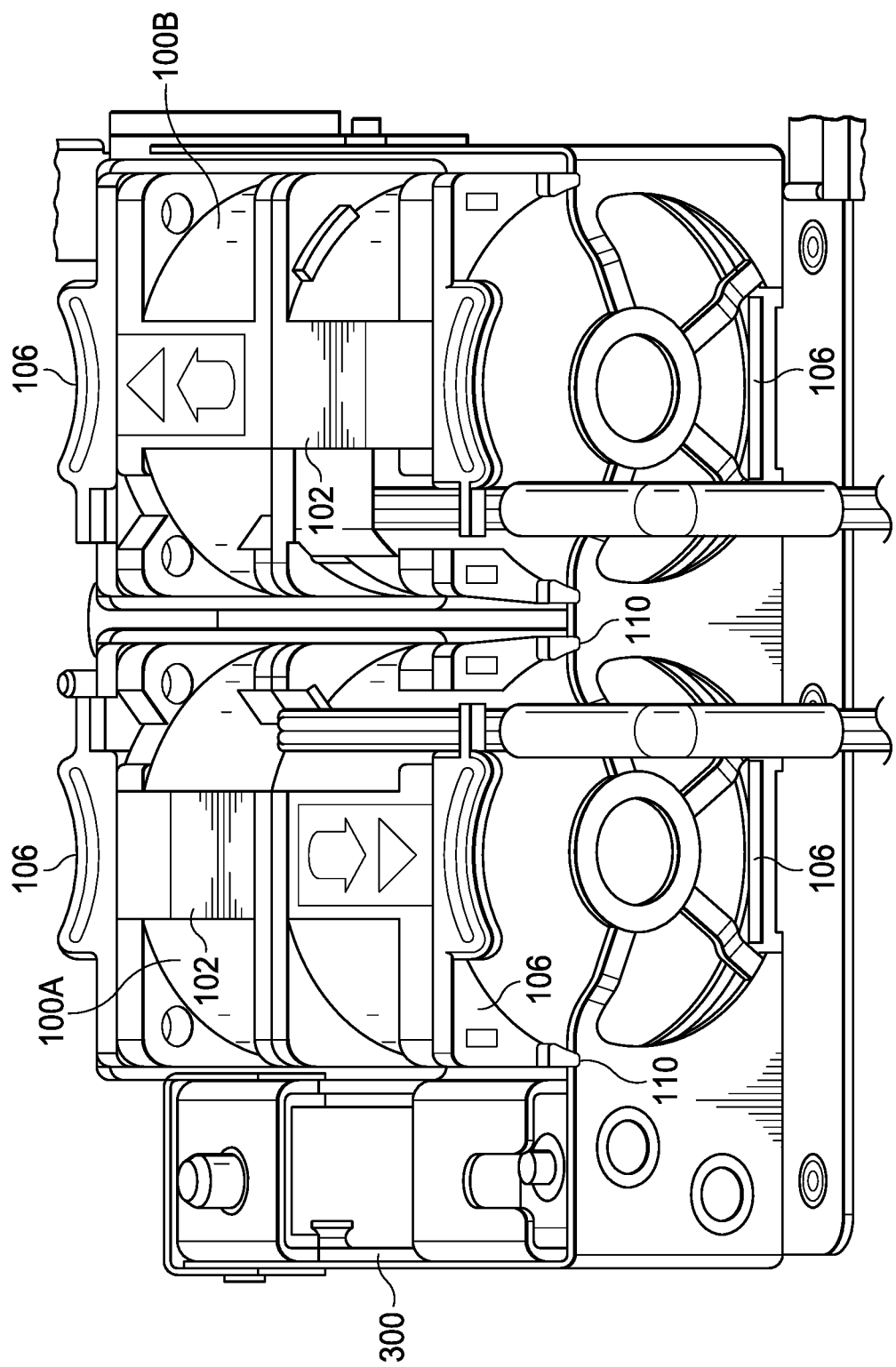
FIG. 3A illustrates a front view of an example air mover gantry with an air mover properly inserted into the air mover gantry, in accordance with embodiments of the present disclosure.
Figure 3B:
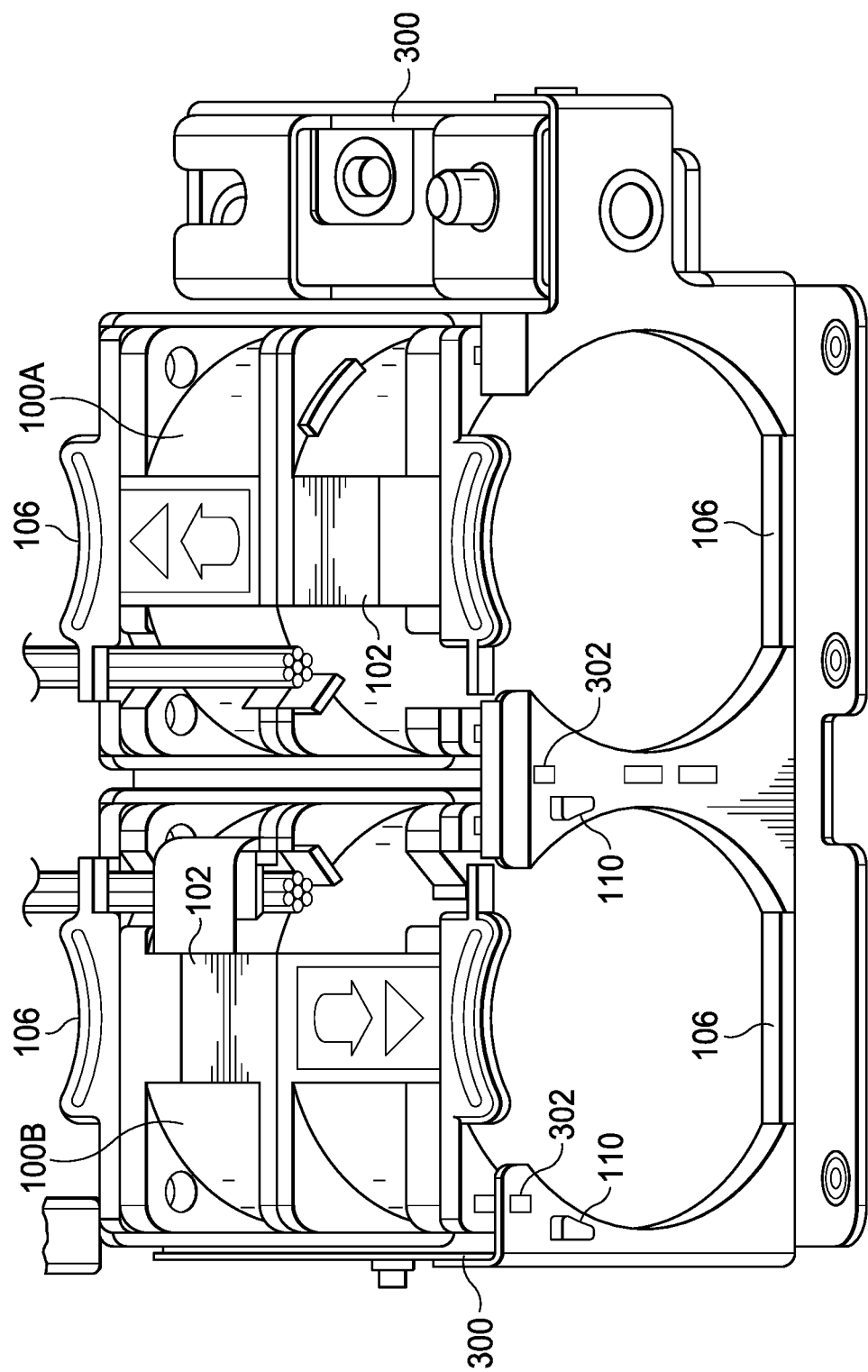
FIG. 3B illustrates a rear view of the example air mover gantry of FIG. 3A, with the air mover improperly inserted into the air mover gantry, in accordance with embodiments of the present disclosure.

FIG. 3A illustrates a front view of an example air mover gantry 300 with an air mover 100A properly inserted into air mover gantry 300, in accordance with embodiments of the present disclosure. FIG. 3B illustrates a rear view of example air mover gantry 300 with air mover 100B improperly inserted into air mover gantry 300, in accordance with embodiments of the present disclosure.

Air mover gantry 300 may include a portion of an information handling system chassis configured to receive and house air movers 100. Air mover gantry 300 may be positioned within a chassis and/or otherwise configured with appropriate mechanical features based on whether air mover gantry 300 will reside in a server in a hot-aisle configuration or a cold-aisle configuration. Depending on its configuration in either a hot-aisle configuration or a cold-aisle configuration, air mover gantry 300 may include interference features 302 that may interact with keying features 110 of air mover holders 106 to ensure proper insertion of air movers 100 in the proper airflow direction of the configuration of air mover gantry 300. For example, as shown in FIG. 3A, because air mover 100A is being inserted properly into air mover gantry 300, air mover 100A may be fully inserted in air mover gantry 300 due to air mover 100A being inserted in its proper orientation relative to air mover gantry 300. On the other hand, as shown in FIG. 3B, keying features 110 of air mover holders 106 of air mover 100B may mechanically interact with interference features 302, thus preventing full insertion of air mover 100B in the improper orientation with respect to air mover gantry 300.

Figure 4A:
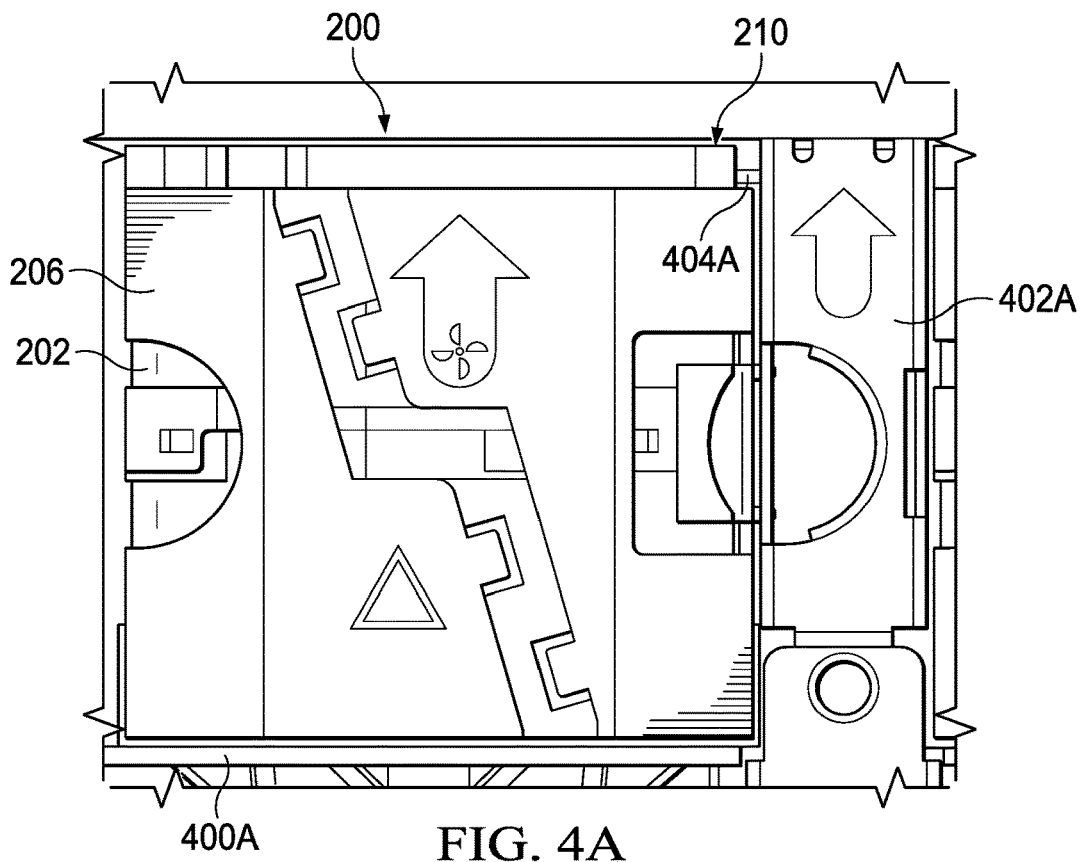
FIG. 4A illustrates a top view of an example air mover gantry and air mover in a hot aisle configuration, in accordance with embodiments of the present disclosure.

FIG. 4A illustrates a top view of an example air mover gantry 400A and air mover 200 in a hot-aisle configuration, in accordance with embodiments of the present disclosure. In such configuration, air mover gantry 400A may have features unique to its hot-aisle configuration, for example configuration indicator 402A and an interference feature 404A extending from configuration indicator 402A. Due to lack of mechanical interference between keying feature 210 and interference feature 404A, air mover 200 may be fully inserted into air mover gantry 400A in the orientation shown in FIG. 4A.

Figure 4B:
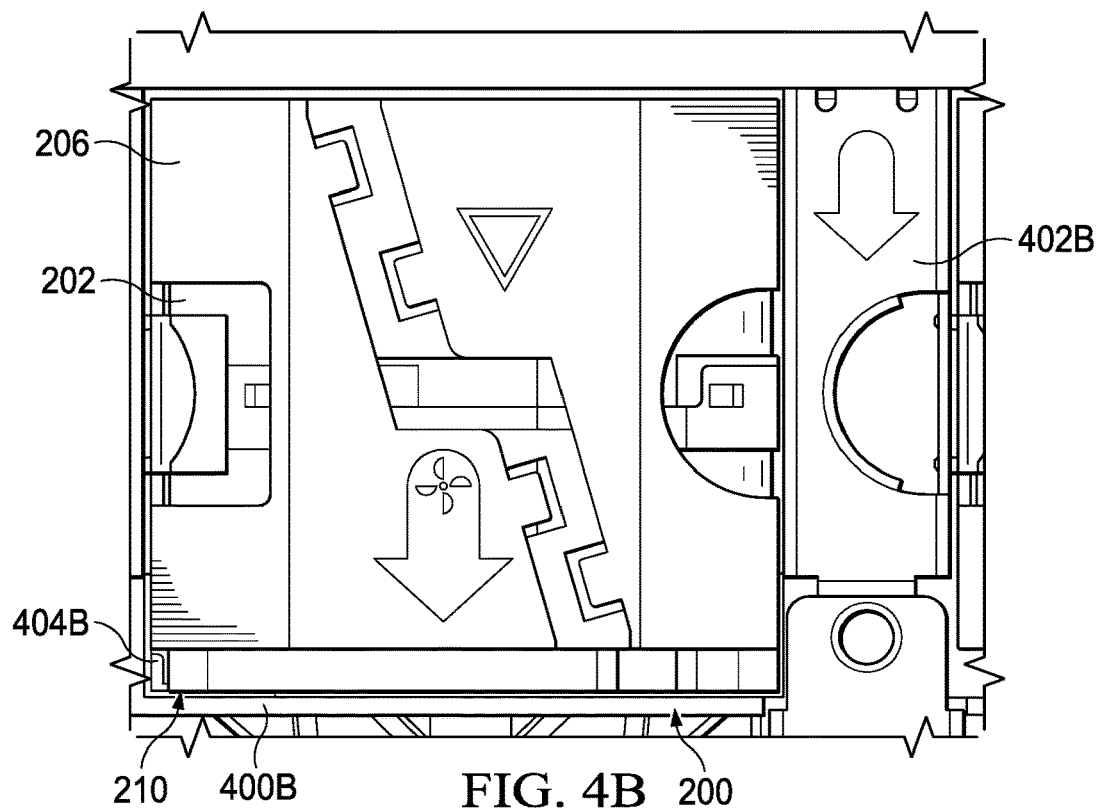
FIG. 4B illustrates a top view of an example air mover gantry and air mover in a cold aisle configuration, in accordance with embodiments of the present disclosure.

FIG. 4B illustrates a top view of an example air mover gantry 400B and air mover 200 in a cold-aisle configuration, in accordance with embodiments of the present disclosure. In such configuration, air mover gantry 400B may have features unique to its cold-aisle configuration, for example configuration indicator 402B and an interference feature 404B extending from a portion of air mover gantry 400B. Due to lack of mechanical interference between keying feature 210 and interference feature 404B, air mover 200 may be fully inserted into air mover gantry 400B in the orientation shown in FIG. 4B.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described below, the principles of the present disclosure may be implemented using any number of techniques, whether currently known or not. The present disclosure should in no way be limited to the exemplary implementations and techniques illustrated in the drawings and described above.

Unless otherwise specifically noted, articles depicted in the drawings are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

What is claimed is:

1. An air mover assembly comprising:
   an air mover comprising a body and a cable extending from the body; and
   one or more air mover holders mechanically coupled to the body and comprising:
      a plurality of cable maintenance features, including:
         a first cable maintenance feature configured to maintain the cable in a first configuration of the air mover in a first airflow direction; and
         a second cable maintenance feature configured to maintain the cable in a second configuration of the air mover in a second airflow direction; and
      a keying feature extending from the one or more air mover holders, wherein the keying feature is configured mechanically interface with an interfering feature of a chassis when an attempt is made to improperly insert the air mover into the chassis in accordance with a proper airflow direction configuration of the chassis, in order to prevent improper insertion of the air mover into the chassis in accordance with the proper airflow direction configuration of the chassis.

2. The air mover assembly of claim 1, wherein the one or more air mover holders include a cable channel for routing the cable from the body to one of the cable maintenance features.

3. An air mover assembly comprising:
   an air mover comprising a body and a cable extending from the body; and
   one or more air mover holders mechanically coupled to the body and comprising:
      a plurality of cable maintenance features, including:
         a first cable maintenance feature configured to maintain the cable in a first configuration of the air mover in a first airflow direction; and
         a second cable maintenance feature configured to maintain the cable in a second configuration of the air mover in a second airflow direction; and
      a keying feature formed by a combination of the one or more air mover holders and a corresponding feature of the chassis, wherein the keying feature is configured to mechanically interface with an interfering feature of a chassis when an attempt is made to improperly insert the air mover into the chassis in accordance with a proper airflow direction configuration of the chassis, in order to prevent improper insertion of the air mover into the chassis in accordance with the proper airflow direction configuration of the chassis.

4. The air mover assembly of claim 3, wherein the one or more air mover holders include a cable channel for routing the cable from the body to one of the cable maintenance features.

5. An information handling system comprising:
   a chassis; and
   an air mover assembly comprising:
      an air mover comprising a body and a cable extending from the body; and
      one or more air mover holders mechanically coupled to the body and comprising:
         a plurality of cable maintenance features, including:
            a first cable maintenance feature configured to maintain the cable in a first configuration of the air mover in a first airflow direction; and
            a second cable maintenance feature configured to maintain the cable in a second configuration of the air mover in a second airflow direction; and
         a keying feature extending from the one or more air mover holders, wherein the keying feature is configured to mechanically interface with an interfering feature of the chassis when an attempt is made to improperly insert the air mover into the chassis in accordance with a proper airflow direction configuration of the chassis, in order to prevent improper insertion of the air mover into the chassis in accordance with the proper airflow direction configuration of the chassis.

6. The information handling system of claim 5, wherein the one or more air mover holders include a cable channel for routing the cable from the body to one of the cable maintenance features.

7. An information handling system comprising:
   a chassis; and
   an air mover assembly comprising:
      an air mover comprising a body and a cable extending from the body; and
      one or more air mover holders mechanically coupled to the body and comprising:
         a plurality of cable maintenance features, including:
            a first cable maintenance feature configured to maintain the cable in a first configuration of the air mover in a first airflow direction; and
            a second cable maintenance feature configured to maintain the cable in a second configuration of the air mover in a second airflow direction; and
         a keying feature formed by a combination of the one or more air mover holders and a corresponding feature of the chassis, wherein the keying feature is configured to mechanically interface with an interfering feature of the chassis when an attempt is made to improperly insert the air mover into the chassis in accordance with a proper airflow direction configuration of the chassis, in order to prevent improper insertion of the air mover into the chassis in accordance with the proper airflow direction configuration of the chassis.

8. The information handling system of claim 7, wherein the one or more air mover holders include a cable channel for routing the cable from the body to one of the cable maintenance features.

9. A method comprising:
   mechanically coupling an air mover comprising a body and a cable extending from the body to one or more air mover holders, wherein the one or more air mover holders include:
      a plurality of cable maintenance features, including:

a first cable maintenance feature configured to maintain the cable in a first configuration of the air mover in a first airflow direction; and a second cable maintenance feature configured to maintain the cable in a second configuration of the air mover in a second airflow direction; and a keying feature extending from the one or more air mover holders, wherein the keying feature is configured to mechanically interface with an interfering feature of a chassis when an attempt is made to improperly insert the air mover into the chassis in accordance with a proper airflow direction configuration of the chassis, in order to prevent improper insertion of the air mover into the chassis in accordance with the proper airflow direction configuration of the chassis.

10. The method of claim 9, wherein the one or more air mover holders include a cable channel for routing the cable from the body to one of the cable maintenance features.

11. A method comprising:

mechanically coupling an air mover comprising a body and a cable extending from the body to one or more air mover holders, wherein the one or more air mover holders include:

a plurality of cable maintenance features, including:

a first cable maintenance feature configured to maintain the cable in a first configuration of the air mover in a first airflow direction; and a second cable maintenance feature configured to maintain the cable in a second configuration of the air mover in a second airflow direction; and a keying feature formed by a combination of the one or more air mover holders and a corresponding feature of the chassis, wherein the keying feature is configured to mechanically interface with an interfering feature of a chassis when an attempt is made to improperly insert the air mover into the chassis in accordance with a proper airflow direction configuration of the chassis, in order to prevent improper insertion of the air mover into the chassis in accordance with the proper airflow direction configuration of the chassis.

12. The method of claim 11, wherein the one or more air mover holders include a cable channel for routing the cable from the body to one of the cable maintenance features.

* * * * *